United States Patent [10] Patent No.: US 11,721,622 B2
Shin et al. [45] Date of Patent: Aug. 8, 2023

(54) SEMICONDUCTOR DEVICES

(71) Applicant: SAMSUNG ELECTRONICS CO., LTD., Suwon-si (KR)

(72) Inventors: Junghoo Shin, Seoul (KR); Sanghoon Ahn, Seongnam-si (KR); Seung Jae Lee, Hwaseong-si (KR); Deokyoung Jung, Seoul (KR); Woojin Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 73 days.

(21) Appl. No.: 17/453,197

(22) Filed: Nov. 2, 2021

(65) Prior Publication Data

US 2022/0238433 A1 Jul. 28, 2022

(30) Foreign Application Priority Data

Jan. 25, 2021 (KR) ........................ 10-2021-0010227

(51) Int. Cl.
*H01L 23/522* (2006.01)
*H01L 23/532* (2006.01)
*H01L 23/528* (2006.01)

(52) U.S. Cl.
CPC ........ *H01L 23/5226* (2013.01); *H01L 23/528* (2013.01); *H01L 23/53204* (2013.01)

(58) Field of Classification Search
CPC ............... H01L 23/5226; H01L 23/528; H01L 23/53204; H01L 21/76804; H01L 23/5283; H01L 21/76816; H01L 21/02126; H01L 21/76807; H01L 21/76877

See application file for complete search history.

(56) References Cited

U.S. PATENT DOCUMENTS

| 5,904,569 | A | 5/1999 | Yu |
| 6,316,838 | B1 | 11/2001 | Mayuzumi |
| 2015/0348903 | A1 | 12/2015 | Melzner |
| 2016/0071802 | A1 | 3/2016 | Chen et al. |
| 2016/0111371 | A1 | 4/2016 | Feng et al. |
| 2019/0164887 | A1 | 5/2019 | Wang et al. |
| 2020/0035605 | A1 | 1/2020 | Tsai et al. |

(Continued)

FOREIGN PATENT DOCUMENTS

| KR | 10-2010-0107211 | 10/2010 |
| KR | 10-2020-0029856 | 3/2020 |
| KR | 10-2020-0085111 | 7/2020 |

*Primary Examiner* — Thanhha S Pham

(74) *Attorney, Agent, or Firm* — F. Chau & Associates, LLC

(57) ABSTRACT

A semiconductor device includes a second insulating layer disposed on a substrate and that includes a first trench that extends in a first direction, a first via disposed in the first hole, a first interconnection layer disposed in the first trench on the first via and that has an upwardly upper region, and a third insulating layer disposed on the second insulating layer and that includes a second hole and a second trench connected to the second hole. The first trench has inclined side surfaces such that a width of the first trench increases in a direction toward the substrate, the second hole has inclined side surfaces such that a width of the second hole decreases in the direction toward the substrate, and a lower portion of the second hole is wider than an upper surface of the first interconnection layer.

20 Claims, 15 Drawing Sheets

(56) References Cited

U.S. PATENT DOCUMENTS

| | | |
|---|---|---|
| 2020/0083162 A1 | 3/2020 | Yang |
| 2020/0219808 A1 | 7/2020 | Hwang et al. |
| 2020/0259083 A1 | 8/2020 | He et al. |
| 2020/0273794 A1* | 8/2020 | Khaderbad ......... H01L 23/5226 |

* cited by examiner

SEMICONDUCTOR DEVICES

CROSS-REFERENCE TO RELATED APPLICATION(S)

This application claims priority under 35 U.S.C. § 119(a) from Korean Patent Application No. 10-2021-0010227, filed on Jan. 25, 2021 in the Korean Intellectual Property Office, the contents of which are herein incorporated by reference in their entirety.

TECHNICAL FIELD

The present disclosure relates to semiconductor devices.

DISCUSSION OF THE RELATED ART

As demand for high performance, high speed, and/or multi-functionality in semiconductor devices has increased, the degree of integration of semiconductor devices has increased. With the trend for high-density semiconductor devices, the size of a transistor has decreased. As a result, the sizes of the interconnections that are electrically connected to these reduced-size transistors have decreased, but high-speed operations are challenging to implement due to increased resistance of the interconnections and increased capacitance between the interconnections.

SUMMARY

Embodiments provide a semiconductor device that includes an interconnection structure that has improved electrical characteristics.

According to an embodiment, a semiconductor device includes: a first insulating layer, a second insulating layer, and a third insulating layer that are sequentially disposed on a substrate; a first interconnection structure that includes a first via and, a first interconnection layer disposed on the first via, where the first via penetrates through the first insulating layer, and where the first interconnection layer is connected to the first via, protrudes upward from an upper surface of the second insulating layer, and, extends in a first direction; and a second interconnection structure that includes a second via and a second interconnection layer disposed on the second via, where the second via penetrates through the third insulating layer, covers an upper surface and a portion of side surfaces of the first interconnection layer, and is wider in a second direction perpendicular to the first direction than the upper surface of the first interconnection layer, and where the second interconnection layer is connected to the second via. The side surfaces of the first interconnection layer are inclined such that a lower portion of the first interconnection layer is wider in the second direction than an upper portion of the first interconnection layer.

According to an example embodiment, a semiconductor device includes: a first insulating layer disposed on a substrate and that includes a first hole that penetrates through the first insulating layer in a vertical direction; a second insulating layer disposed on the first insulating layer and includes a first trench that extends in a direction parallel to an upper surface of the substrate; a first via disposed in the first hole of the first insulating layer; a first interconnection layer disposed in the first trench of the second insulating layer, where the first interconnection layer is connected to the first via and includes an upper region that protrudes upward from an upper surface of the first insulating layer; a third insulating layer disposed on the second insulating layer and the first interconnection layer, wherein the third insulating layer includes a second hole that penetrates through the third insulating layer in the vertical direction and a second trench connected to the second hole; a second via disposed in the second hole of the third insulating layer; and a second interconnection layer disposed in the second trench of the third insulating layer. The first trench has inclined side surfaces such that a width of the first trench increases in a direction toward the substrate. The second hole has inclined side surfaces such that a width of the second hole decreases in the direction toward the substrate. A lower portion of the second hole is wider than an upper surface of the first interconnection layer.

According to an example embodiment, a semiconductor device includes: a first insulating layer, a second insulating layer, and a third insulating layer that are sequentially disposed on a substrate; a first via that penetrates through the first insulating layer a first interconnection layer connected to the first via, protrudes upward from the second insulating layer, and includes at least one region that has a linear shape when viewed in a plan view; a second via that penetrates through the third insulating layer and covers an upper surface and a portion of side surfaces of the first interconnection layer; and a second interconnection layer connected to the second via and that includes at least one region that has a linear shape when viewed in a plan view. A lower portion of the first interconnection layer is wider than an upper portion of the first interconnection layer. The lower portion of the first interconnection layer is wider than an upper portion of the first via.

DETAILED DESCRIPTION

Hereinafter, exemplary embodiments will be described with reference to the accompanying drawings.

Figure 1:
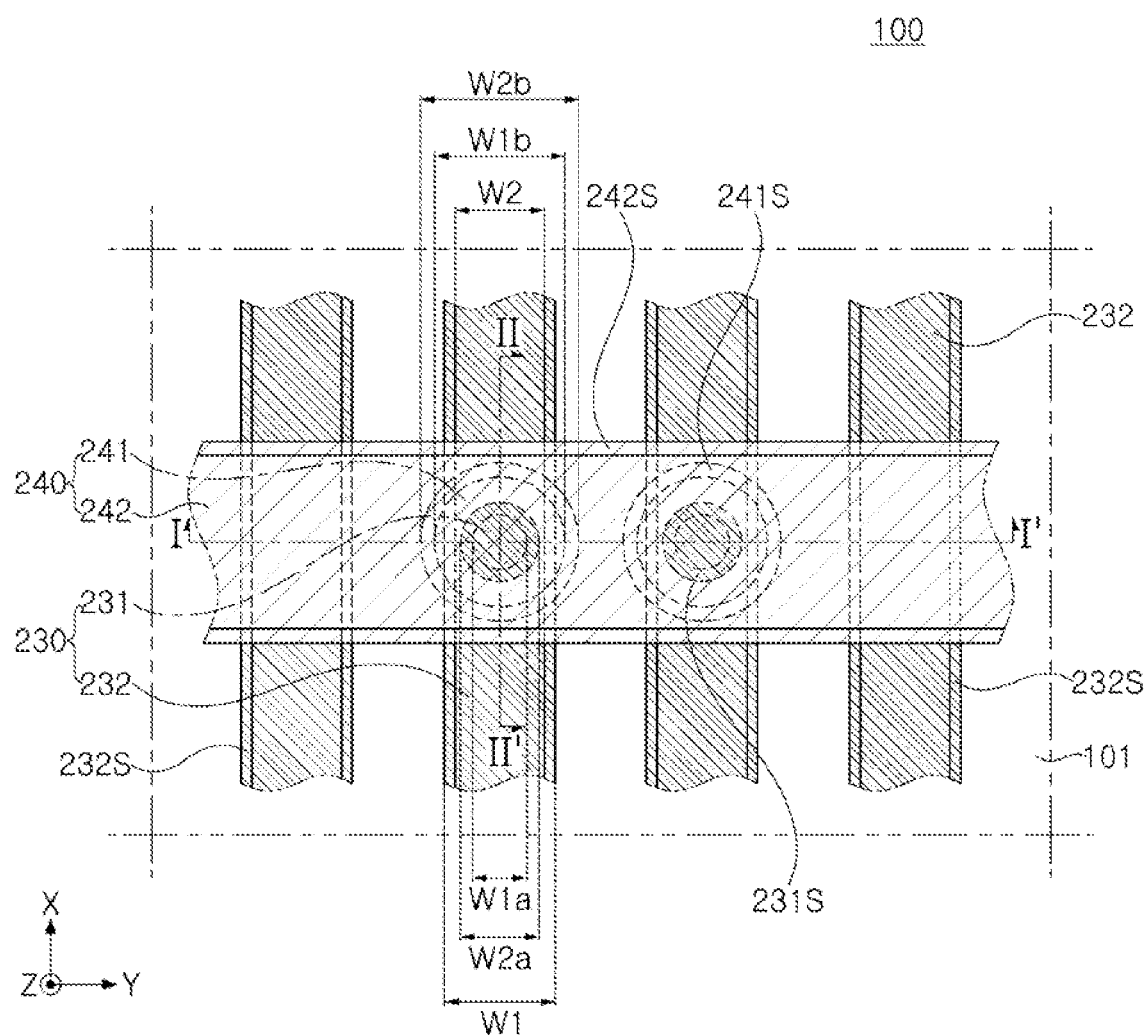
FIG. 1 is a plan view of a semiconductor device according to embodiments.

FIG. 1 is a plan view of a semiconductor device according to embodiments.

Figure 2:
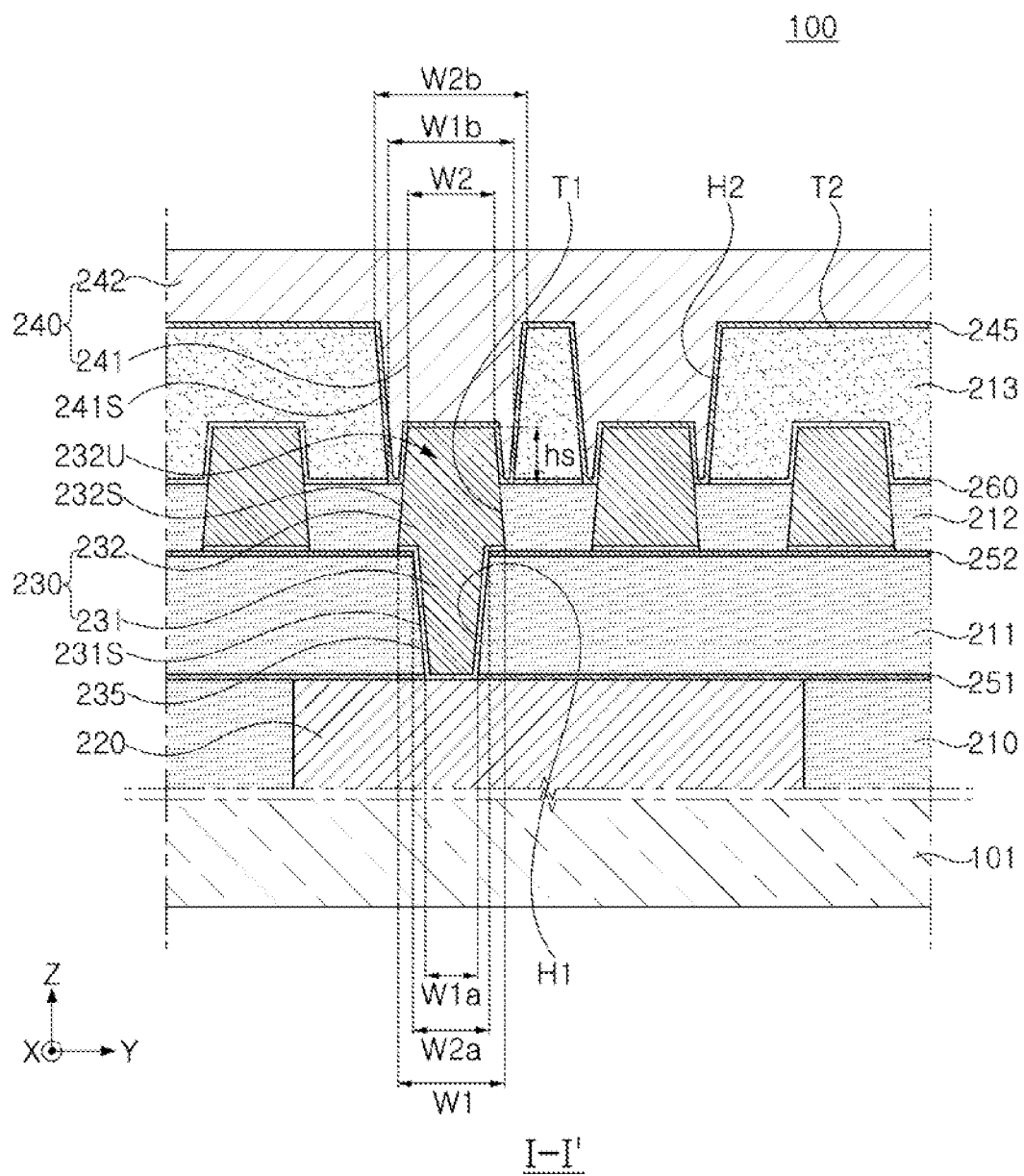
FIG. 2 is a cross-sectional view of a semiconductor device according to embodiments.

FIG. 2 is a cross-sectional view of a semiconductor device according to example embodiments. FIG. 2 illustrates a cross-section of a semiconductor device taken along line I-I' of FIG. 1.

Figure 3:
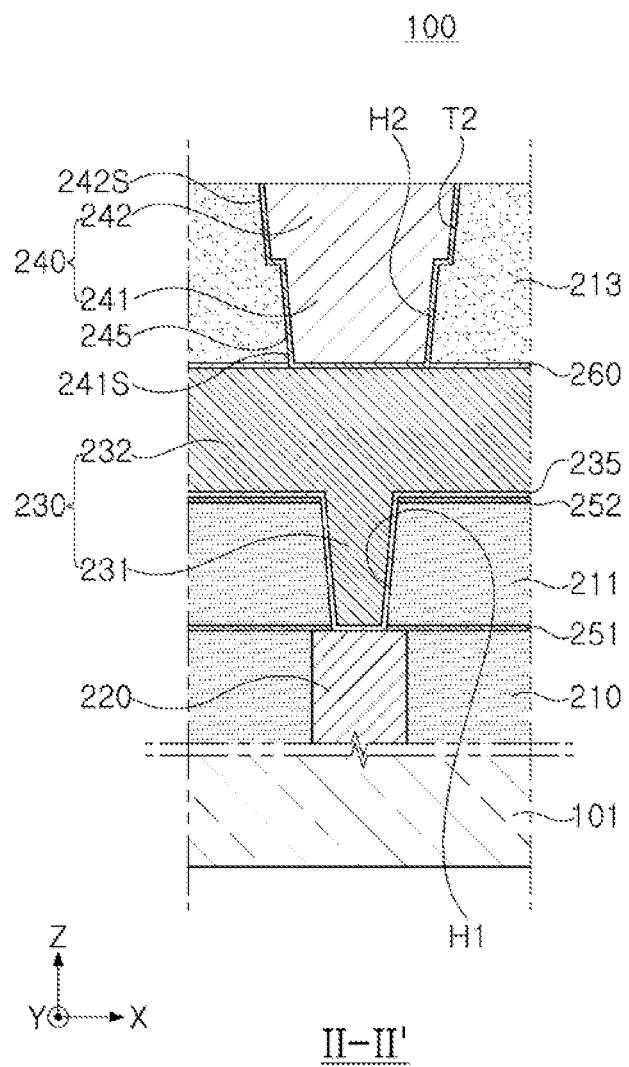
FIG. 3 is a cross-sectional view of a semiconductor device according to embodiments.

FIG. 3 is a cross-sectional view of a semiconductor device according to example embodiments. FIG. 3 illustrates a cross-section of a semiconductor device taken along line II-II' of FIG. 1.

Referring to FIGS. 1 to 3, according to embodiments, a semiconductor device 100 includes a substrate 101, insulating structures 210, 211, 212 and 213, a first interconnection structure 230, and a second interconnection structure 240.

The first interconnection structure 230 includes a first via 231 and a first interconnection layer 232. The second interconnection structure 240 includes a second via 241 and a second interconnection layer 242. The semiconductor device 100 further includes a lower interconnection layer 220, etch-stop layers 251 and 252, and liner layers 235 and 260.

According to embodiments, the substrate 101 includes a semiconductor material such as a group IV semiconductor, a group III-V compound semiconductor, or a group II-VI compound semiconductor. For example, the group IV semiconductor may include silicon (Si), germanium (Ge), or silicon-germanium (SiGe). The substrate 101 may be provided as a bulk wafer, an epitaxial layer, a silicon-on-insulator (SOI) layer, a semiconductor-on-insulator (SeOI) layer, etc. Transistors that constitute an integrated circuit are disposed on the substrate 101.

According to embodiments, the transistors that constitute the integrated circuit may include a planar metal-oxide-semiconductor FET (MOSFET), a FinFET in which an active region has a fin structure, a multi-bridge channel FET (MBCFET™) or a gate-all-around transistor that includes a plurality of channels vertically stacked on the active region, or a vertical FET (VFET).

According to embodiments, the insulating structures 210, 211, 212, and 213 are disposed on the substrate 101. The insulating structures 210, 211, 212, and 213 are interlayer insulating layers in a region in which interconnection layers of a back end of line (BEOL) are disposed. The interconnection layers of BEOL are disposed on transistors that constitute the integrated circuit, and may transmit an electrical signal to the transistors or may electrically connect the transistors to each other. The BEOL includes a via structure that vertically connects interconnection layers to each other.

According to embodiments, the insulating structures 210, 211, 212, and 213 include a plurality of insulating layers. For example, the insulating structures 210, 211, 212, and 213 include a lower insulating layer 210, a first insulating layer 211, a second insulating layer 212, and a third insulating layer 213 sequentially disposed on the substrate 101. The insulating structures 210, 211, 212, and 213 may be formed of a silicon oxide or a low-k dielectric material that has a lower dielectric constant than silicon oxide. For example, at least one of the insulating structures 210, 211, 212, and 213 includes a low-k dielectric material such as SiOCH or SiOC.

When an interconnection layer is formed by a metal etching process other than a damascene process, loss of carbon (C) in an insulating material, caused by plasma, can be significantly reduced, such that the low-k dielectric material layer contains a relatively high concentration of carbon. Accordingly, parasitic capacitance formed by the interlayer insulating layer of the insulating structures 210, 211, 212, and 213 can be reduced to suppress RC time delay. As a result, operating speed of the semiconductor device can be increased. The concentration of carbon (C) in the low-k dielectric material layer ranges from about 10 atomic % to about 20 atomic %. When the concentration of carbon (C) is less than the above range, the suppression of the RC time delay can be insignificant. When the concentration of carbon (C) is greater than the above range, structural stability of the low-k dielectric material layer can deteriorate.

According to embodiments, in the lower insulating layer 210, the lower interconnection layer 220 extends in a direction parallel to an upper surface of the substrate 101, such as a Y-direction. The lower interconnection layer 220 is electrically connected to the transistors of the integrated circuit that are disposed therebelow through a contact structure. The lower interconnection layer 220 includes a metal such as aluminum (Al), copper (Cu), tungsten (W), cobalt (Co), ruthenium (Ru), or molybdenum (Mo), and/or a metal nitride such as titanium nitride (TiN), tantalum nitride (TaN), or tungsten nitride (WN).

According to embodiments, the first via 231 is disposed in a first hole H1 that penetrates through the first insulating layer 211 in a Z-direction. In an embodiment, side surfaces 231S of the first via 231 disposed in the first hole H1 are inclined such that a lower width W1a in the Y direction is smaller than an upper width W2a. Widths of the first via 231 and the first hole H1 in the Y-direction decrease toward the substrate 101. The first via 231 connects the lower interconnection layer 220 and the first interconnection layer 232 to each other. The first via 231 penetrates through the first etch-stop layer 251 to contact an upper surface of the lower interconnection layer 220. A cross-sectional shape of the first via 231 may be circular, elliptical, or rectangular, but embodiments are not limited thereto.

According to embodiments, the first interconnection layer 232 is disposed in a first trench T1 in the second insulating layer 212 and is connected to the first via 231. The first trench T1 extends in a direction parallel to the upper surface of the substrate 101, such as an X-direction. At least one region of the first interconnection layer 232 has a linear shape when viewed in a plan view. The first interconnection layer 232 includes an upper region 232U that upwardly protrudes from an upper surface of the second insulating layer 212. The upper region 232U is disposed in a second hole H2 in the third insulating layer 213, and has at least a portion that is surrounded by the second via 241. An upper surface of the first interconnection layer 232 and an upper surface of the second insulating layer 212 form a step hs due to a level difference in the Z-direction. A height of the step hs in the Z-direction ranges from about 1 nm to about 5 nm. For example, the upper surface of the first interconnection layer 232 is disposed at a higher level than the upper surface of the second insulating layer 212 in the Z-direction.

In an embodiment, side surfaces 232S of the first interconnection layer 232 are inclined such that a first width W1 in the y-direction of a lower portion of the first interconnection layer 232 is greater than a second width W2 of an upper portion of the first interconnection layer 232. The first width W1 is greater than widths W1a and W2a of lower and upper portions of the first via 231. The second width W2 is smaller than widths W1b and W2b of lower and upper portions of the second via 241. The first trench T1 has inclined internal surfaces, and each has a width that increases in the X-direction toward the substrate 101. In an embodiment, the inclined internal surfaces of the first trench coincide with at least a portion of the side surfaces 232S of the first interconnection layer 232. In an embodiment, the first width W1 ranges from about 8 nm to about 12 nm, and the second width W2 ranges from about 6 nm to about 10 nm.

According to embodiments, the first interconnection structure 230 includes conductive layers 231 and 232, in which the first vias 231 and the first interconnection layer 232 are formed and are integrated with each other, and a first liner layer 235 provided below the conductive layers 231 and 232. In an embodiment, the first via 231 can be understood as including the first liner layer 235 disposed in the first hole H1. The conductive layers 231 and 232 include at least one metal that can be easily patterned by an etching process, such as aluminum (Al), tungsten (W), cobalt (Co), ruthenium (Ru), or molybdenum (Mo). The conductive layers 231 and 232 have a structure that diners from a structure formed by a damascene process. For example, a metal layer can be etched from an upper portion of the first interconnection layer 232, so that a width W2 of the upper portion of the first interconnection layer 232 is smaller than a width W1 of a lower portion thereof. The first liner layer 235 is disposed along a lower surface and side surfaces of the first via 231. A portion of the first liner layer 235 is provided along a lower surface of the first interconnection layer 232. The first liner layer 235 increases adhesion between the conductive layers 231 and 232 and the insulating layer 211 to improve reliability of the semiconductor device 100. The first liner layer 235 includes at least one of aluminum oxide (AlOx), aluminum nitride (AlN), titanium oxide ($TiO_2$), silicon oxycarbide (SiOC), graphene, molybdenum sulfide (MoS), tantalum sulfide (TaS), or tantalum silicon (TaSi).

According to embodiments, the second via 241 is disposed in a second hole H2 that penetrates through the third insulating layer 213 in the Z-direction. In an embodiment, side surfaces 241s of the second via 241 in the second hole H2 are inclined such that a width W1b in the Y-direction of a lower portion is smaller than a width W2b of an upper portion. Widths in the Y-direction of the second vias 241 and the second hole H2 decrease toward the substrate 101. The second via 241 connects, for example, the first interconnection layer 232 and the second interconnection layer 242 to each other. The second via 241 covers an upper surface and a portion of the side surfaces 232s of the first interconnection layer 232. The width W1b of the lower portion of the second via 241 in the second hole H2 is greater than the second width W2 of the first interconnection layer 232. The widths W1b and W2b of the second via 241 are greater than the second width W2 of the first interconnection layer 232. Due to an increased contact area of the second via 241 and the first interconnection layer 232, resistance of the metal interconnection is reduced to suppress RC time delay and to improve operating speed and electrical characteristics of the semiconductor device 100.

According to embodiments, the second interconnection layer 242 is disposed in the second trench T2 in the third insulating layer 213 and is connected to the second via 241. The second trench T2 extends in a direction parallel to the upper surface of the substrate 101, such as the X-direction. At least one region of the second interconnection layer 242 has a linear shape when viewed in a plan view. As illustrated in FIG. 3, side surfaces 242s of the second interconnection layer 242 are inclined such that a width in the X-direction of a lower portion of the second interconnection layer 242 is smaller than a width an upper portion of the second interconnection layer 242. The second trench T2 has inclined internal side surfaces such that widths in the X-direction of the second trench T2 decrease toward the substrate 101, and the first trench T1 has inclined internal side surfaces such that widths in the Y-direction of the first trench T1 increase toward the substrate 101.

According to embodiments, the second interconnection structure 240 includes conductive layers 241 and 242, in which the second via 241 and the second interconnection layer 242 are integrated with each other, and a barrier layer 245 provided below the conductive layers 241 and 242. In an embodiment, the second via 241 may be understood as including a barrier layer 245 disposed in the second hole H2. The conductive layers 241 and 242 include, for example, a metal such as copper (Cu) or aluminum (Al). The barrier layer 245 is disposed along a lower surface and side surfaces of the second via 241. The barrier layer 245 is provided along, side surfaces and a lower surface of the second interconnection layer 242. The barrier layer 245 includes at least one metal nitride, such as titanium nitride (TiN), tantalum nitride (TaN), or tungsten nitride (WN). The barrier layer 245 may include graphene. The second interconnection structure 240 constitutes a dual damascene structure. However, embodiments are not limited thereto, and in other embodiments, the second interconnection structure 240 constitutes a single damascene structure.

According to embodiments, the etch-stop layers 251 and 252 include a first etch-stop layer 251 between the lower insulating layer 210 and the first insulating layer 211 and a second etch-stop layer 252 between the first insulating layer 211 and the second insulating layer 212. Each of the etch-stop layers 251 and 252 serves as a stopper to stop etching of an insulating layer. A lower portion of the first via 231 penetrates through the first etch-stop layer 251, and an upper portion of the first via 231 penetrates through the second etch-stop layer 252. The etch-stop layers 251 and 252 are formed of a material that has an etch selectivity with respect to the insulating structures 210, 211, 212, and 213. The etch-stop layers 251 and 252 include at least one of aluminum oxide (AlOx), aluminum oxynitride (AlON), aluminum oxycarbide (AlOC), aluminum zirconium oxide ($Al_xZr_yO_z$), or aluminum hafnium oxide ($Al_xHf_yOx$). The etch-stop layers 251 and 252 may further include at least one of titanium (Ti), tantalum (Ta), cobalt (CO), zirconium (Zr), ruthenium (Ru), lanthanum (La), or hafnium (Hf), other than aluminum (Al).

According to embodiments, the second liner layer 260 is disposed between the second insulating layer 212 and the third insulating layer 213. The second liner layer 260 is an adhesive layer that improves adhesive power of the first interconnection layer 232 and the third insulating layer 213 and also serves as a stopper to stop etching of the insulating layer. The second liner layer 260 has a bent portion that corresponds to a step structure of the second insulating layer 212 and the first interconnection layer 232, and covers a portion of the side surfaces of an upper region 232u of the first interconnection layer 232. The second liner layer 260 is formed of the same material as the first liner layer 235. However, according other embodiments the liner layers 235 and 260 can be omitted.

Figure 4:
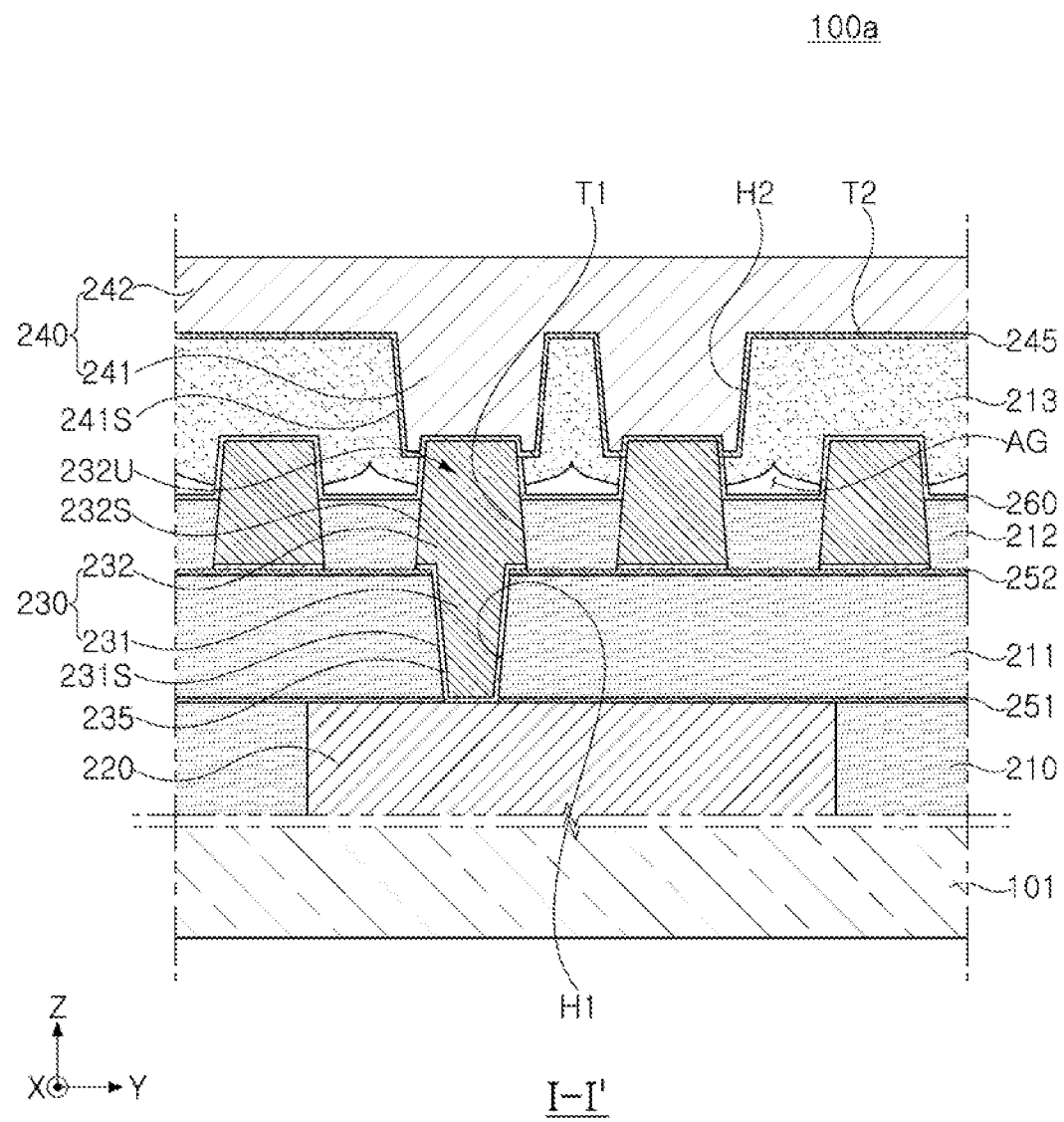
FIG. 4 is a cross-sectional view of a semiconductor device according to embodiments.

FIG. 4 is a cross-sectional view of a semiconductor device according to embodiments. FIG. 4 illustrates a region corresponding to FIG. 2 as another example of a semiconductor device according to embodiments.

Referring to FIG. 4, a semiconductor device 100A further includes an airgap AG. The airgap AG is formed between side surfaces 232s of a first interconnection layer 232 and between a second insulating layer 212 and a third insulating layer 213. The airgap AG is an empty space surrounded by the third insulating layer 213 and a second liner layer 260. The third insulating layer 213 includes a concave recess in a Z-direction along an interface with the airgap AG. The airgap AG is formed during deposition of an insulating material layer on a step between the second insulating layer 212 and the first interconnection layer 232. Due to the airgap AG, parasitic capacitance of the second insulating layer 212 can be reduced between the first interconnection layers 232. Accordingly, RC time delay can be reduced and operating speed and electrical characteristics of the semiconductor device 100a can be improved.

FIGS. 5A to 5G are process flow diagrams that illustrate a method of fabricating a semiconductor device according to embodiments.

Figure 5A:
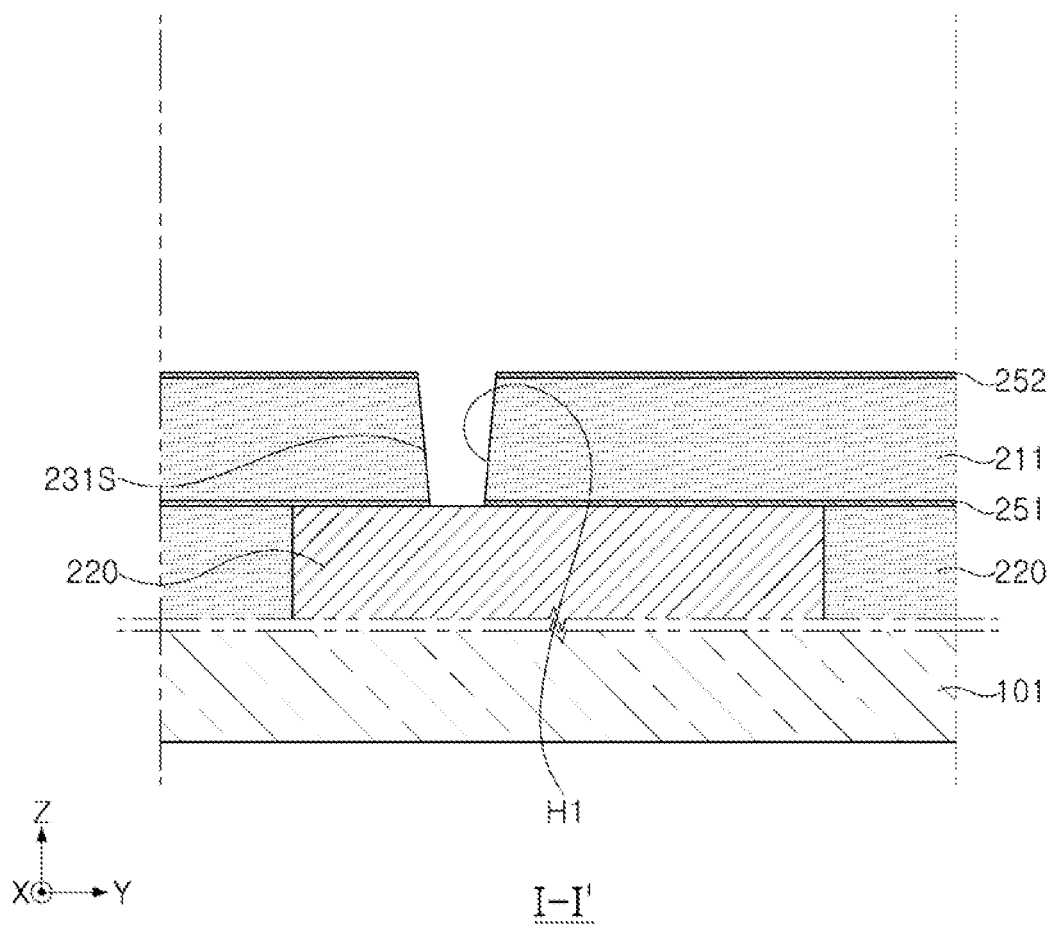
FIGS. 5A to 5G are process flow diagrams of a method of fabricating a semiconductor device according to embodiments.

Referring to FIG. 5A, according to embodiments, a lower insulating layer 210, a lower interconnection layer 220, and a first insulating layer 211 are formed on a substrate 101 in which an integrated circuit is disposed, and a first hole H1 is be formed that penetrates through the first insulating layer 211.

According to embodiments, transistors are formed on the substrate 101 before forming the lower insulating layer 210 and the lower interconnection layer 220. The transistors can be formed using a front end of line (FEOL) process. The transistors include an active region 105, a gate structure 160, and source/drain regions 150 that are described with reference to FIGS. 6A and 6B.

According to embodiments, a first etch-stop layer 251 is formed on the lower insulating layer 210 and the lower interconnection layer 220, and a first insulating layer 211 is formed on the first etch-slop layer 251. A second etch-stop layer 252 is formed on the first insulating layer 211, and a first hole H1 is formed through the second etch-stop layer 252, the first insulating layer 211 and the first etch-stop layer 251 using a patterning process. The first hole H1 penetrates through the etching-stop layers 251 and 252, and the first insulating layer 211 and exposes a portion of an upper surface of the lower interconnection layer 220.

Figure 5B:
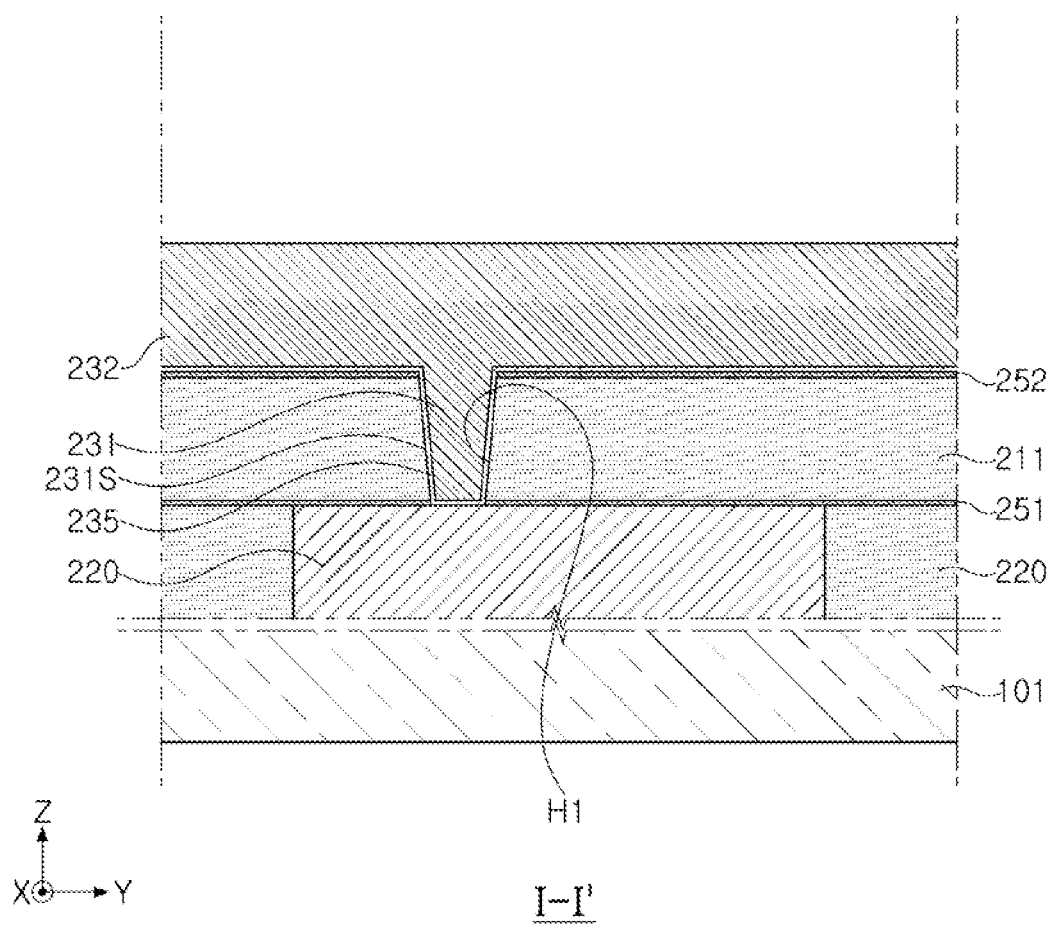

Referring to FIG. 5B, according to embodiments, a first liner layer 235 and conductive layers 231 and 232 may be formed.

According to embodiments, the first liner layer 235 is formed that conformally covers an internal surface of the first hole H1 and a bottom surface of the first hole H1 and an upper surface of the second etch-stop layer 252. A portion of the conductive layers 231 and 232 fills an internal space of the first hole H1 and forms a first via 231.

Figure 5C:
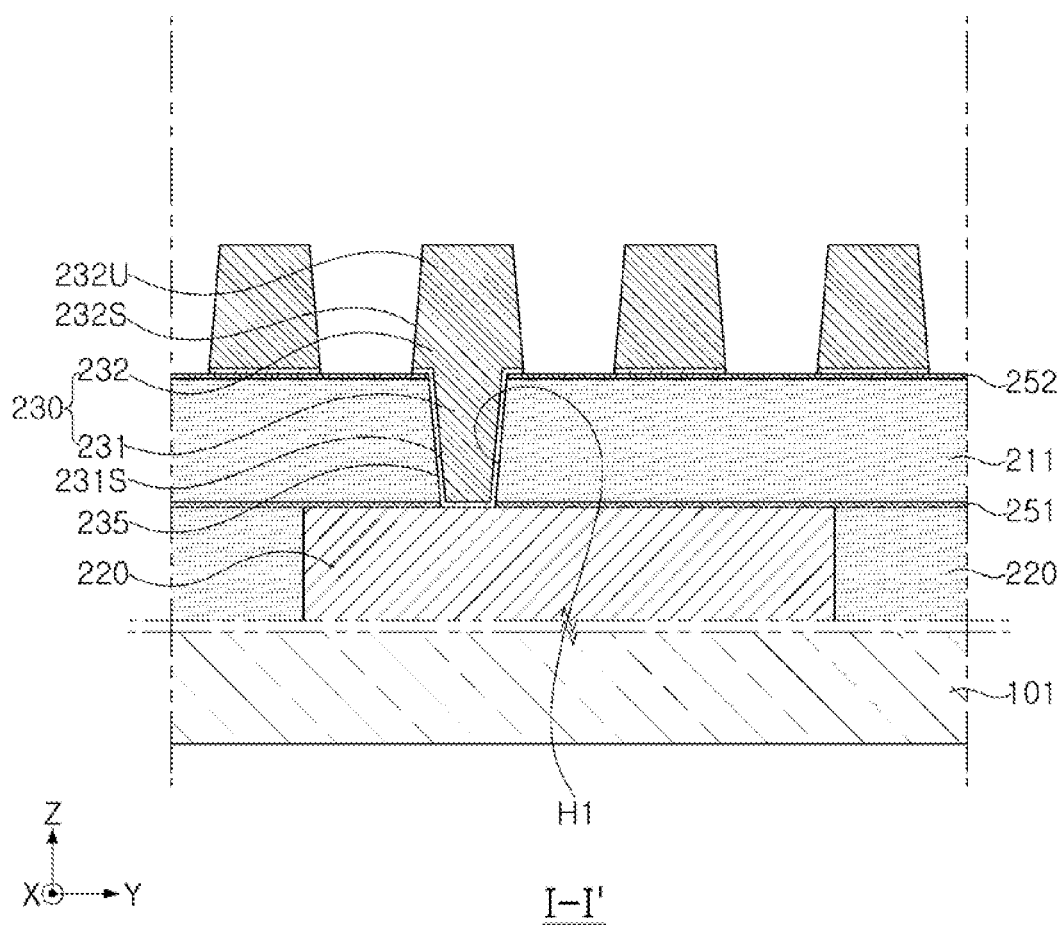

Referring to FIG. 5C, according to embodiments, a first interconnection layer 232 is formed by patterning a portion of the conductive layers 231 and 232 on the first insulating layer 211.

According to embodiments, an additional mask pattern is formed using a photolithography process, and a portion of the conductive layers 231 and 232 are removed using an etching process that forms the first interconnection layer 232. The first interconnection layer 232 is formed such that at least one region has a linear shape that extends in an X-direction, and a plurality of first interconnection layers 232 are spaced apart from each other in a Y-direction. A portion of the first liner layer 235 is also removed from the first insulating layer 211 along with the conductive layer 232.

Figure 5D:
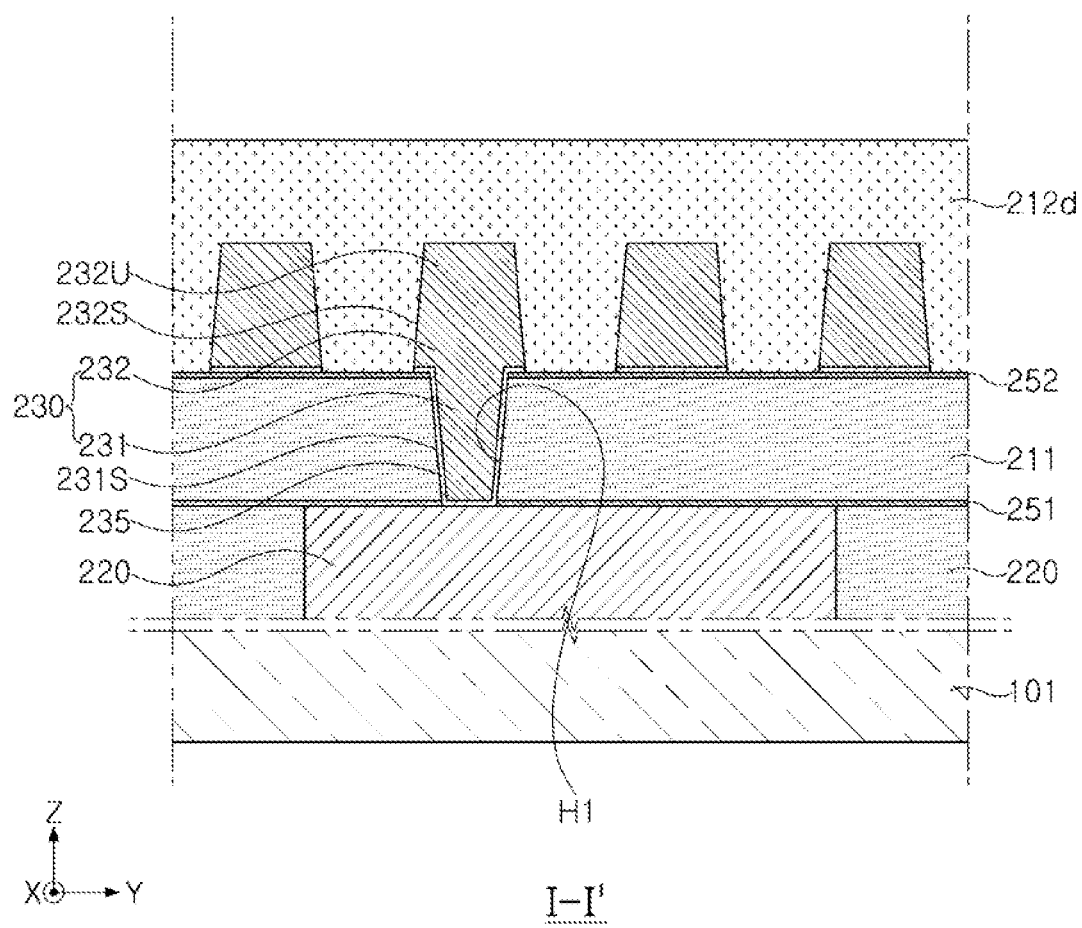

Referring to FIG. 5D, according to embodiments, an insulating layer 212d is formed on the first insulating layer 211 and the first interconnection layer 232.

According to embodiments, the insulating layer 212d is a flowable low-k dielectric layer. The insulating layer 212d covers a step formed by the first insulating layer 211 and the first interconnection layer 232. For example, the insulating layer 212d is formed between side surfaces of adjacent first interconnection layers 232 and on upper surfaces of the first interconnection layers 232. The insulating layer 212d has different compositions in an upper region and a lower region thereof. For example, the insulating layer 212d may include SiOCH or SiOC, and a content of oxygen in the upper region and a content of oxygen in the lower region may differ from each other. For example, in the insulating layer 212d, the content of oxygen in the upper region is greater than the content of oxygen in the lower region. Accordingly, a depth of removal of the insulating layer 212d during an etching process to be described below can be controlled.

Figure 5E:
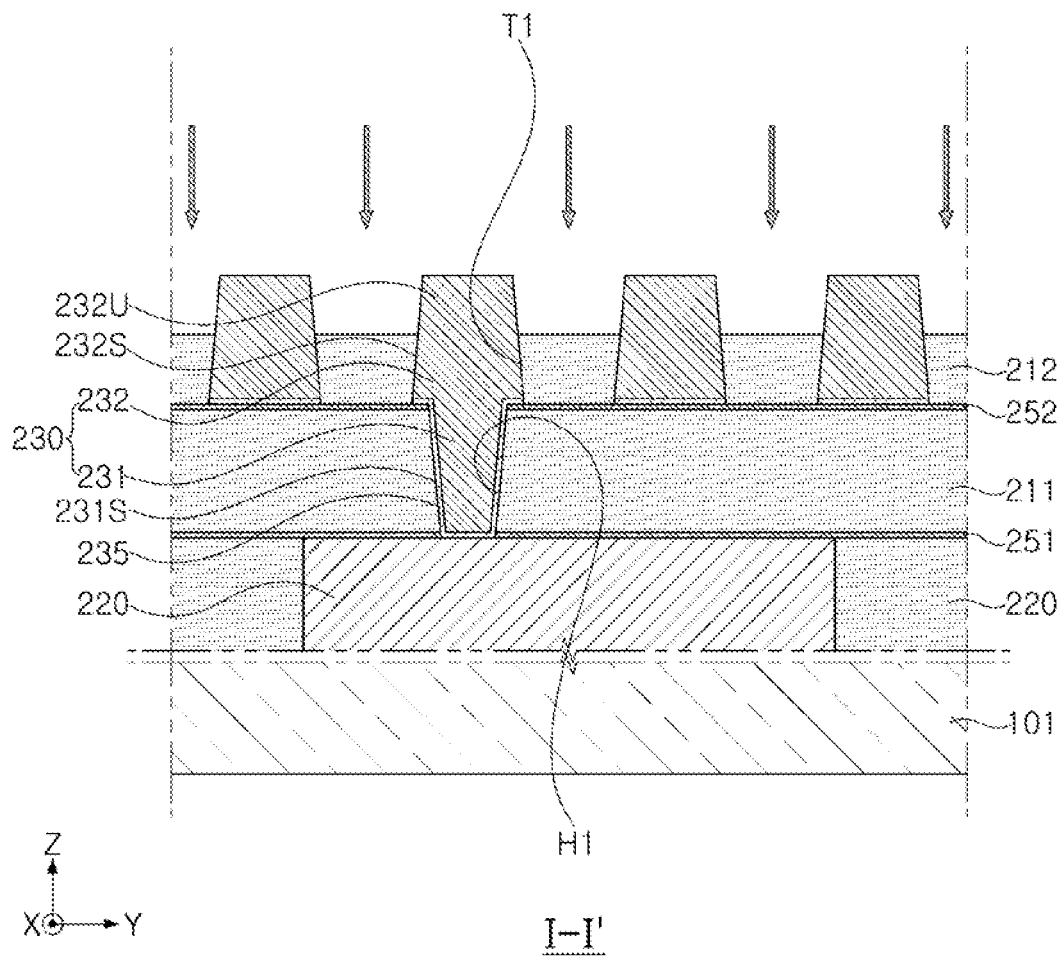

Referring to FIG. 5E, according to embodiments, a portion of the upper region of the insulating layer 212d is removed from an upper portion thereof using an etching process that forms a second insulating layer 212.

According to embodiments, a process of removing the upper region of the insulating layer 212d may be, for example, a dry etching process or a wet etching process. A portion of the insulating layer 212d is removed that exposes a portion of an upper surface and side surfaces of the first interconnection layer 232. Accordingly, an upper region 232U of the first interconnection layer 232 protrudes from and is exposed by the second insulating layer 212. When the insulating layer 212d has different compositions in the upper region and the lower region, and a portion of the upper region of the insulating layer 212d is removed using a wet etching process, the insulating layer 212d is not exposed to plasma, and thus, a concentration of carbon (C) in the insulating layer does not decrease.

Unlike the fabricating operations of FIGS. 5D and 5E, a flowable low-k dielectric layer can be formed without performing an etching process, such that an upper surface thereof is disposed at a level lower than a level of an the upper surface of the first interconnection layer 232.

Figure 5F:
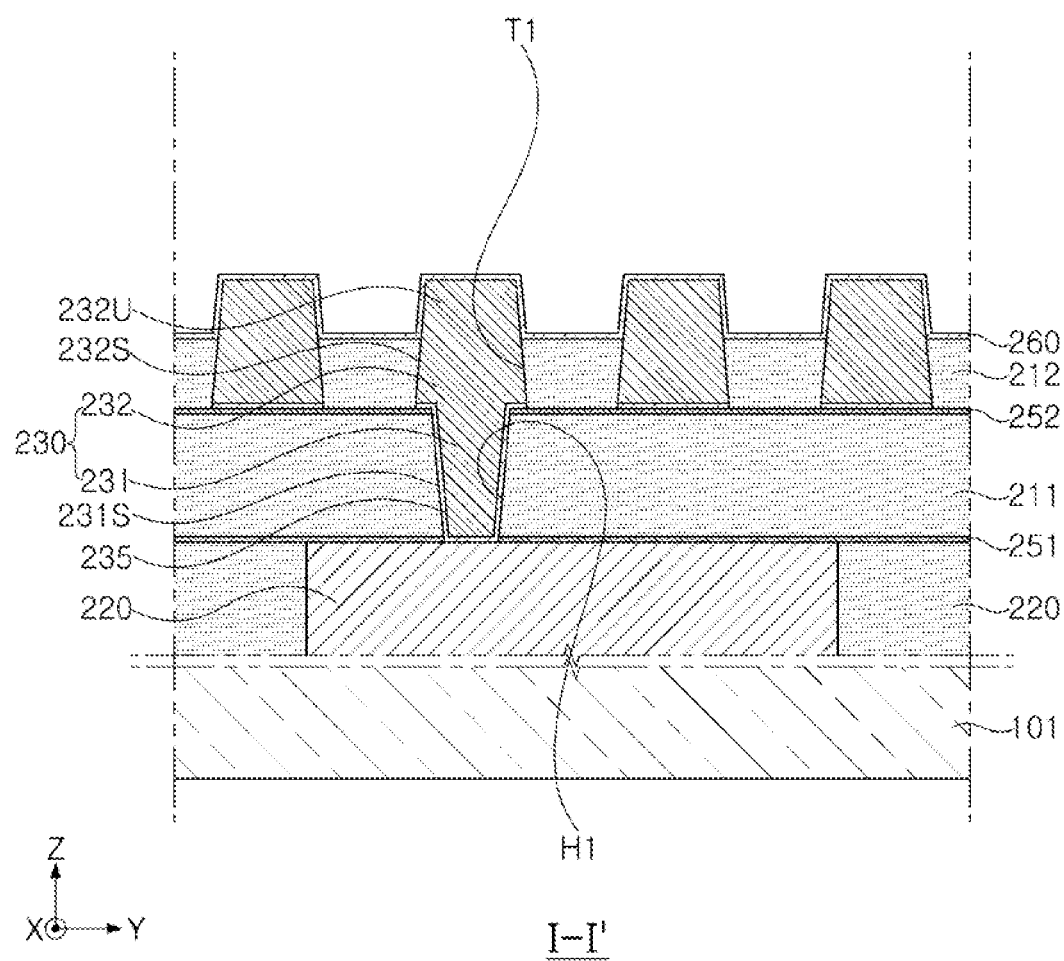

Referring to FIG. 5F, according to embodiments, a second liner layer 260 is formed on the second insulating layer 212 and the first interconnection layer 232.

According to embodiments, the second liner layer 260 is an adhesive layer and covers an upper surface of the second insulating layer 212 that is upwardly exposed between the first interconnection layers 232, and an upper surface and portions of side surfaces of the first interconnection layer 232. The second liner layer 260 covers the upper region 232U of the first interconnection layer 232.

Figure 5G:
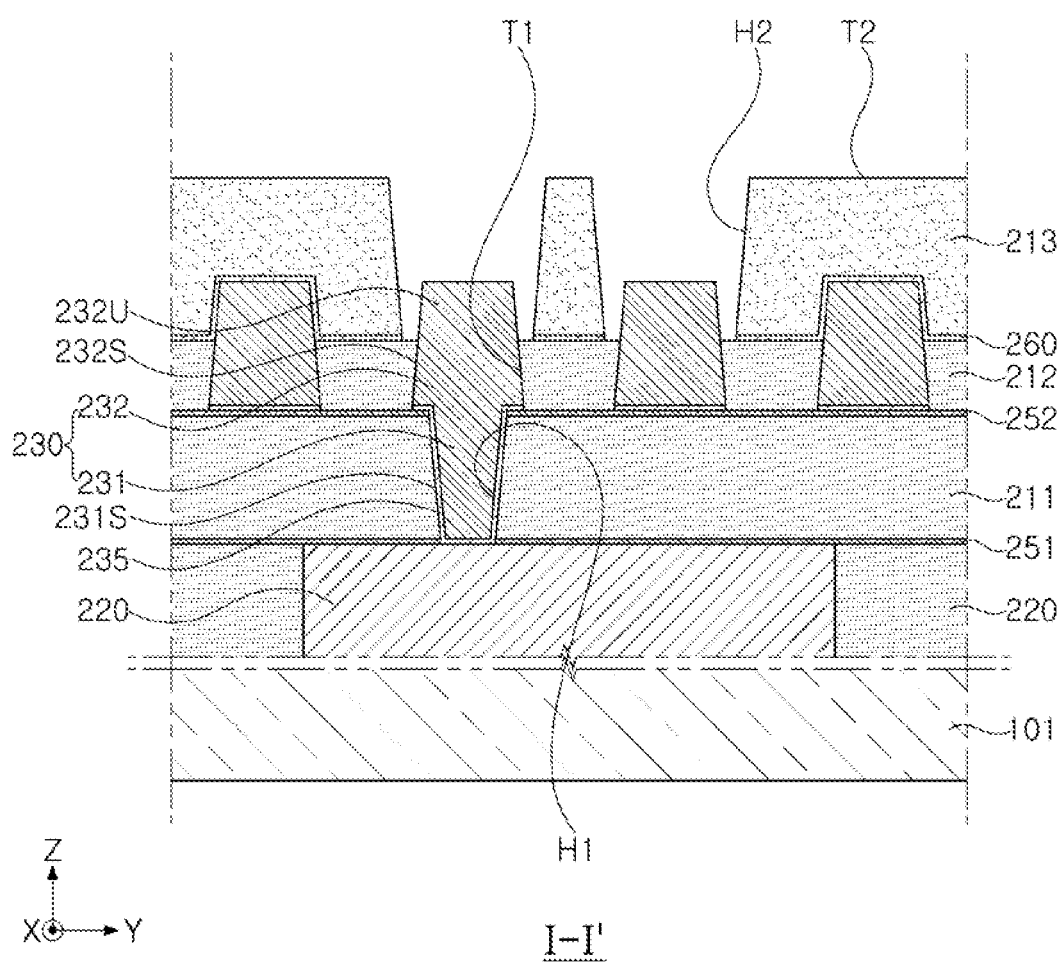

Referring to FIG. 5G, according to embodiments, a third insulating layer 213 is formed on the second insulating layer 212 and a second hole H2 is formed that penetrates through the third insulating layer 213.

According to embodiments, the second hole H2 is wider than the first interconnection layer 232. Accordingly, the upper surface and portions of the side surfaces of the first interconnection layer 232 are exposed by a second hole H2. Accordingly, the second via 241 is formed to be wider than the first interconnection layer 232 and to cover the upper surface and portions of the side surfaces of the first interconnection layer 232, so that resistance of a metal interconnection can be reduced. A portion of the second liner layer 260 is removed by forming the second hole H2 and performing, for example, a wet cleaning process.

Referring to FIGS. 2 and 3 together, according to embodiments, a barrier layer 245 is formed, and conductive layers 241 and 242 are formed that constitute the second via 241 and the second interconnection layer 242. When the second interconnection structure 240 is formed by a dual damascene process before forming the second hole H2, a second trench T2 is formed that extends in a Y-direction, a barrier layer and a seed metal layer are formed in the second hole H2 and the second trench T2, and electroplating is performed. As a result, the semiconductor device 100 of FIGS. 1 to 3 can be fabricated.

Figure 6A:
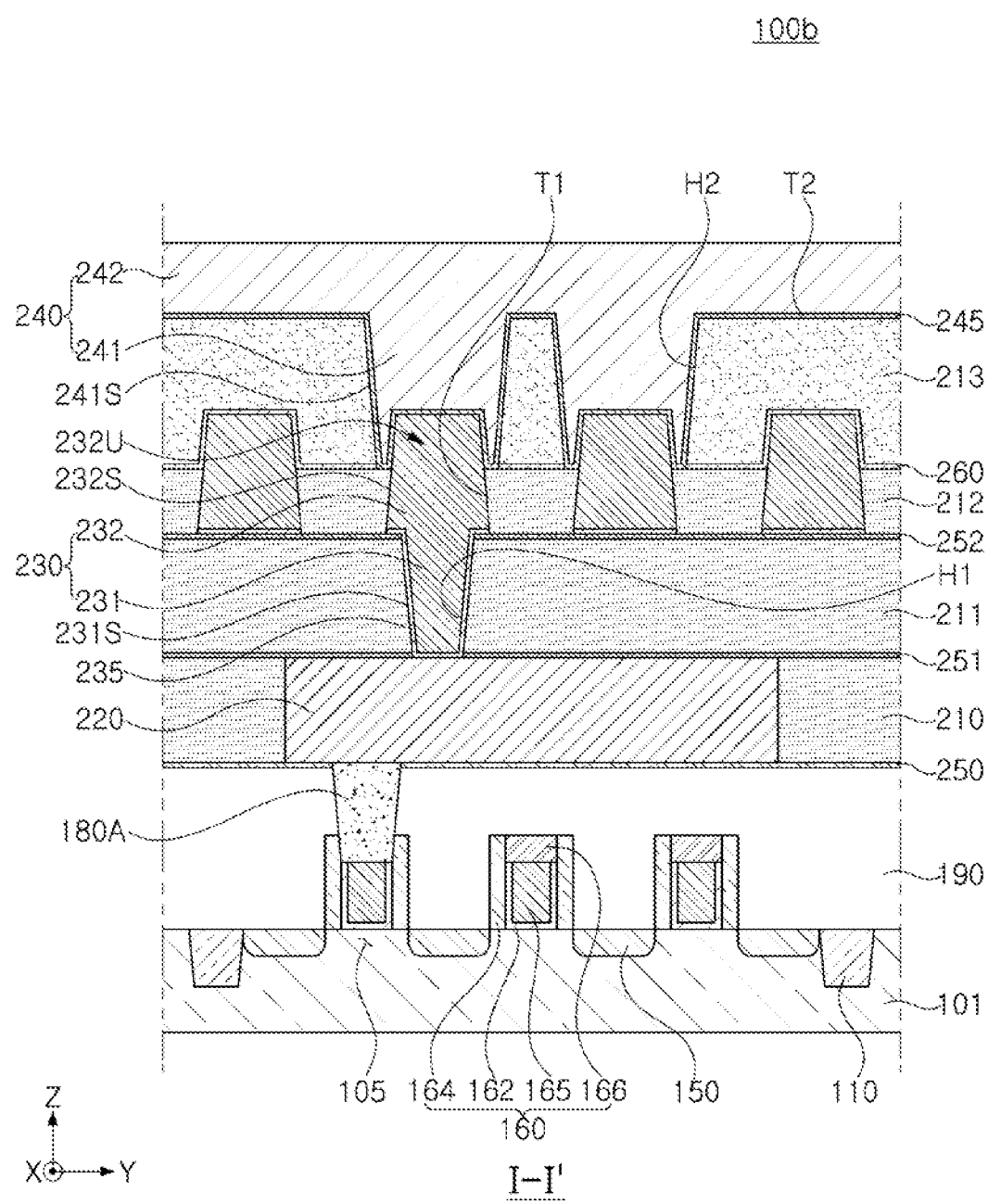
FIGS. 6A and 6B are cross-sectional views of a semiconductor device according to embodiments.
Figure 6B:
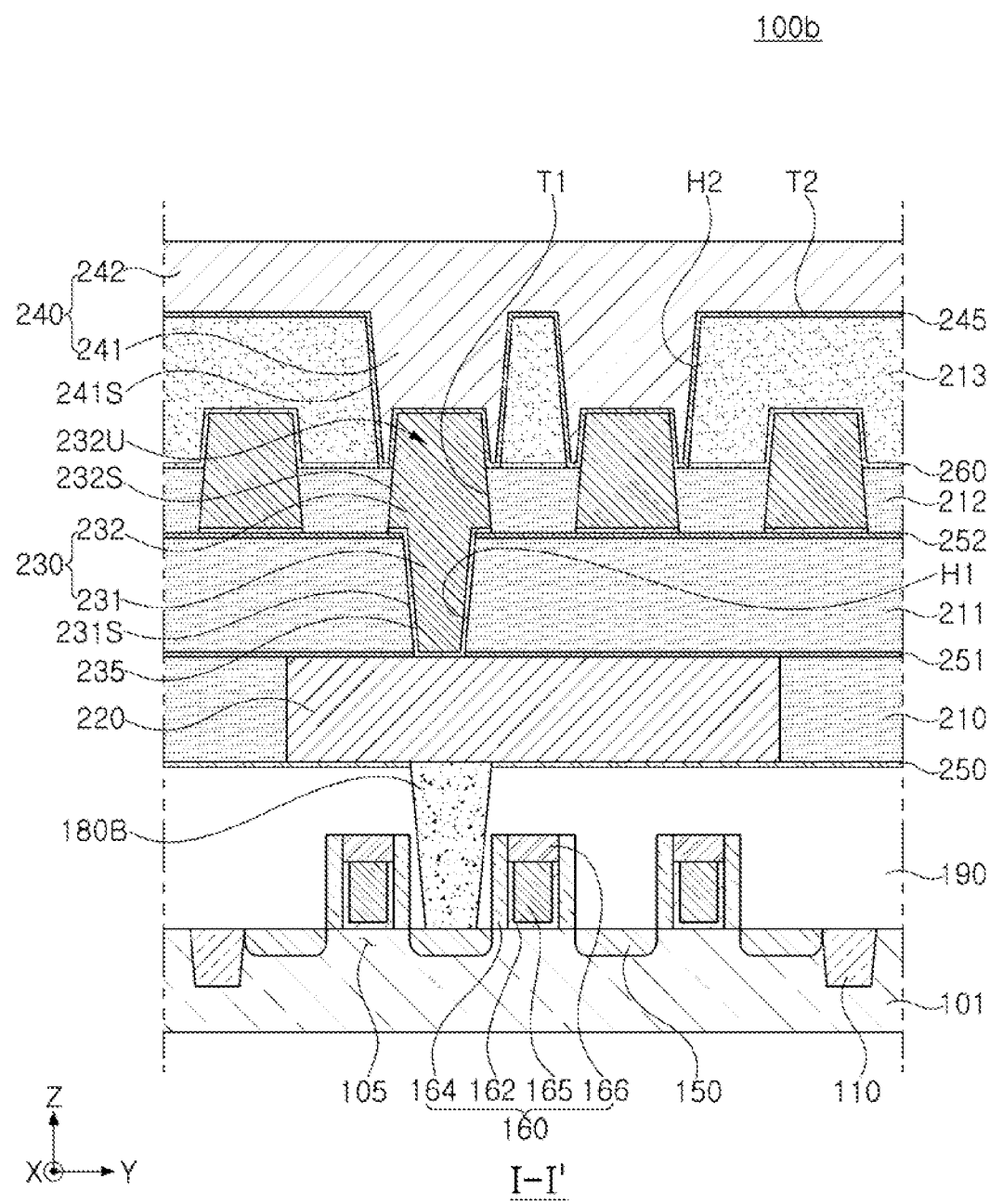

FIGS. 6A to 6B are cross-sectional views of a semiconductor device according to embodiments.

FIGS. 6A to 6B illustrate an example of a transistor that constitutes an integrated circuit provided on a substrate 101 in a semiconductor device 100b. The transistor includes an active region 105 on the substrate 101, a gate structure 160 that extends and intersects the active region 105, and source/drain regions disposed on the active region 105 on opposite sides adjacent to the gate structure 160. The semiconductor device 100b further includes an interlayer insulating layer 190 and contact structures 180A and 180B.

According to embodiments, the active region 105 is defined by a device isolation layer 110 in the substrate 101 and extends, for example, in an X-direction. The active region 105 includes impurities, and at least some of the active regions 105 include impurities that have different conductivity types, but embodiments are not limited thereto. For example, the active region 105 can have a fin structure that protrudes from the substrate 101, and the transistor can be a FinFET. For another example, the transistor can be a multi-bridge channel FET (MBCFET™) surrounded by the gate electrode 165 on the active region 105 and that further includes channel layers spaced apart from each other in a Z-direction.

According to embodiments, the device isolation layer 110 defines the active region 105 in the substrate 101. The device isolation layer 110 is formed by, for example, a shallow trench isolation (STI) process.

According to embodiments, the source/drain regions 150 are a source region or a drain region of the transistor. The source/drain regions 150 are disposed on opposite sides adjacent to the gate structure 160. The source/drain regions 150 are a semiconductor layer that includes silicon (Si), and may include an epitaxial layer. The source drain regions 150 include impurities of different types and/or different concentrations. For example, the source/drain regions 150 may include N-type doped silicon (Si) and/or P-type doped silicon-germanium (SiGe). In embodiments, the source/drain regions 150 include a plurality of regions that include elements and/or doping elements at different concentrations.

According to embodiments, the gate structure 160 extends in one direction, such as the x direction, and intersects the active region 105. A channel region of the transistor is formed in the portion of the active region 105 that intersects the gate structure 160. The gate structure 1600 includes a gate electrode 165, a gate dielectric layer 162 between the gate electrode 165 and the active region 105, spacer layers 164 on side surfaces of the gate electrode 165, and a gate capping layer 166 on an upper surface of the gate electrode 165.

According to embodiments, the gate dielectric layer 162 includes one of an oxide, a nitride, or a high-k dielectric material. The high-k dielectric material has a higher dielectric constant than silicon oxide ($SiO_2$). The high-k dielectric material includes at least one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

According to embodiments, the gate electrode 165 includes a conductive material, such as a metal nitride such as titanium nitride (TiN), tantalum nitride (TaN), or tungsten nitride (WN), and/or a metal such as aluminum (Al), tungsten (W), or molybdenum (Mo), or a semiconductor material such as doped polysilicon. The gate electrode 165 may include two or more multiple layers.

According to embodiments, the spacer layers 164 are disposed on both side surfaces of the gate electrode 165 and extend in the Z-direction, perpendicular to an upper surface of the substrate 101. The spacer layers 164 insulate the source drain regions 150 and the gate electrodes 165 from each other. The spacer layers 164 have a multilayer structure according to embodiments. The spacer layers 164 include one of an oxide, a nitride, or an oxy nitride and, in particular, may include a low-k dielectric layer.

According to embodiments, the gate capping layer 166 is disposed on the gate electrode 165. Side surfaces of the gate capping layer 166 are surrounded by spacer layers 164. The gate capping layer 166 includes at least one of an oxide, a nitride, or an oxynitride and, in detail, may include at least one of SiO, SiN, SiCN, SiOC, SiON, or SiOCN.

According to embodiments, the contact structures 180A and 180B include a first contact structure 180A that is connected to the gate electrode 165 as illustrated in FIG. 6A, and a second contact structure 180B that is connected to the source/drain regions 150 as illustrated in FIG. 6B. Contact structures 180A and 180B penetrate through an interlayer insulating layer 190 and are connected to a lower interconnection layer 220 to be electrically connected to the first interconnection structure 230 and the second interconnection structure 240. The contact structures 180A and 180B are included in a single semiconductor device.

Figure 7A:
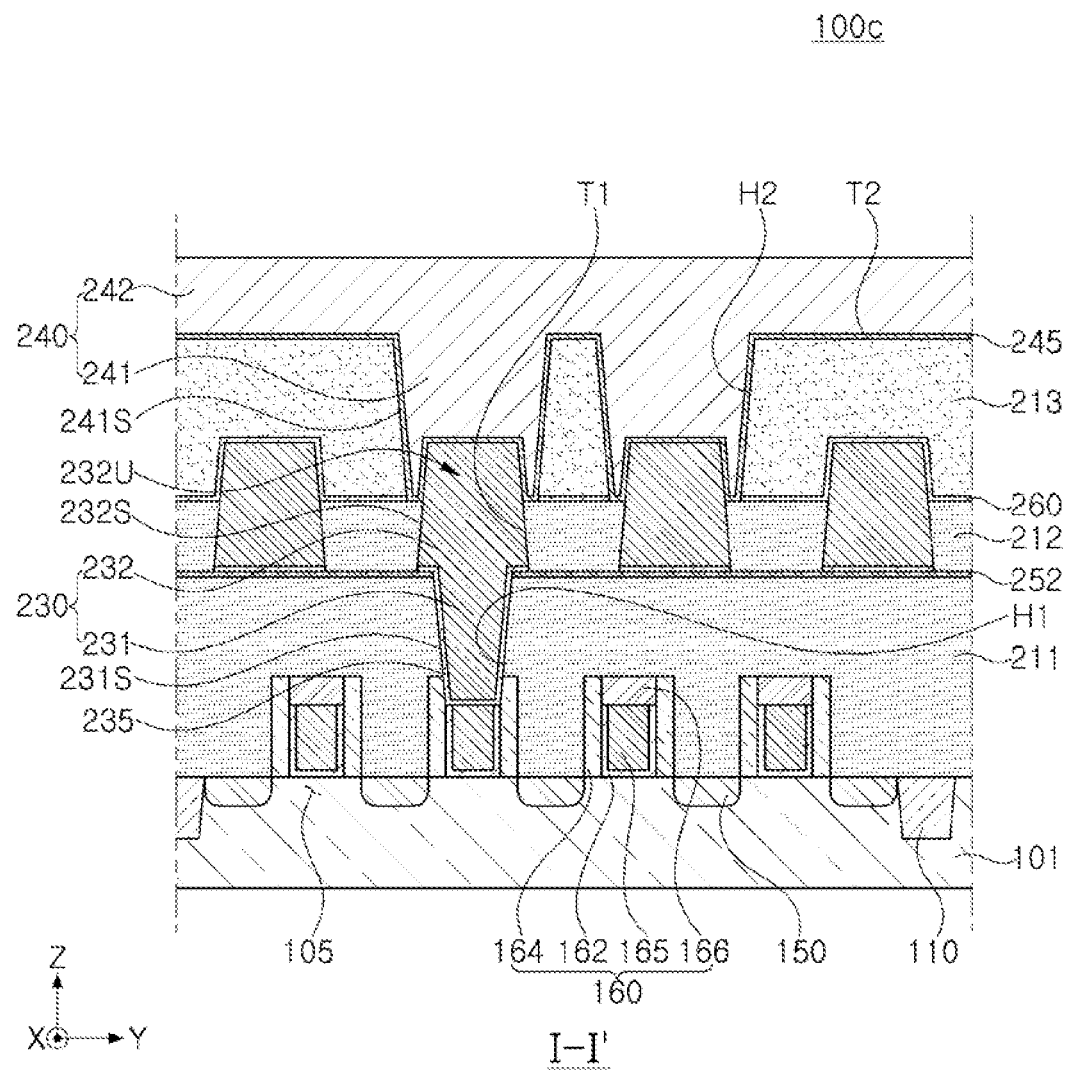
FIGS. 7A and 7B are cross-sectional views of a semiconductor device according to embodiments.
Figure 7B:
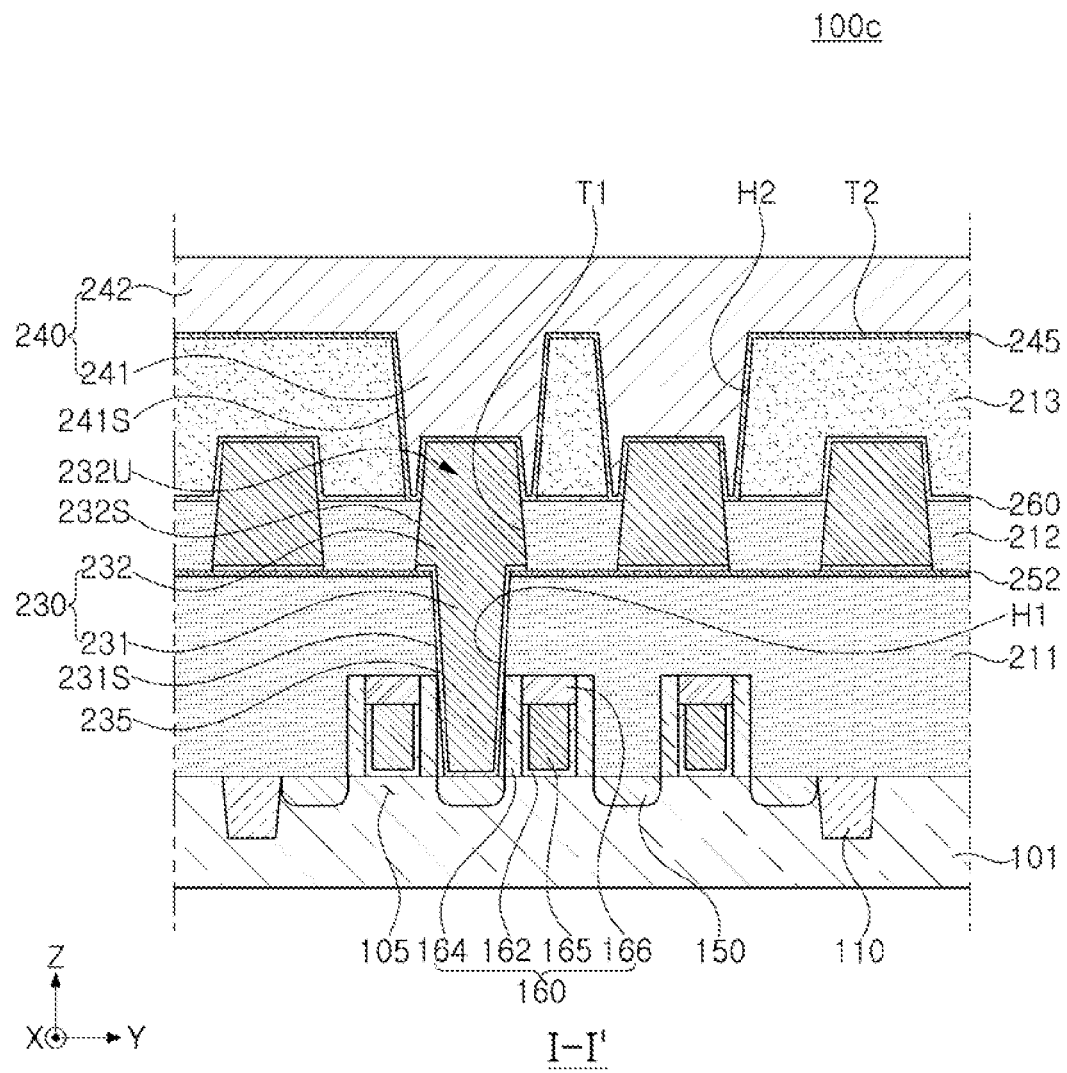

FIGS. 7A and 7B are cross-sectional views of a semiconductor device according to embodiments.

Referring to FIGS. 7A and 7B, according to embodiments, a semiconductor device 100c includes, for example, the transistor of FIGS. 6A and 6B, a first insulating layer 211 that includes tetraethyl orthosilicate (TEOS) and covers the transistor, and a first via 231 of a first interconnection structure 230. The first via 231 penetrates through a gate capping layer 166 and directly connects to a gate electrode 165, or penetrates through a first insulating layer 211 between gate structures 160 and directly connects to source/drain regions 150. Descriptions of other configurations may refer to the description of the semiconductor device 100 of FIGS. 1 to 3.

As described above, a lower interconnection layer that has an upper width greater than a lower width is formed by a metal etching process, and an upper via is disposed that surrounds a protruding upper region of the lower interconnection layer and is wider than the lower interconnection layer. As a result, a semiconductor device having increased operating speed and improved electrical characteristics can be provided.

While embodiments have been shown and described above, it will be apparent to those of ordinary skill in the art that modifications and variations can be made without departing from the scope of embodiments of the present inventive concept as defined by the appended claims.

What is claimed is:

1. A semiconductor device, comprising:
   a first insulating layer, a second insulating layer, and a third insulating layer that are sequentially disposed on a substrate;
   a first interconnection structure that includes a first via and a first interconnection layer disposed on the first via, wherein the first via penetrates through the first insulating layer, and wherein the first interconnection layer is connected to the first via, protrudes upward from an upper surface of the second insulating layer, and extends in a first direction; and
   a second interconnection structure that includes a second via and a second interconnection layer disposed on the second via, wherein the second via penetrates through the third insulating layer, covers an upper surface and a portion of side surfaces of the first interconnection layer, and is wider in a second direction perpendicular to the first direction than the upper surface of the first interconnection layer, and wherein the second interconnection layer is connected to the second via, wherein the side surfaces of the first interconnection layer are inclined such that a lower portion of the first interconnection layer is wider in the second direction than an upper portion of the first interconnection layer.

2. The semiconductor device of claim 1, wherein side surfaces of the first via are inclined such that a width in the second direction of a lower portion of the first via is smaller than a width of an upper portion of the first via.

3. The semiconductor device of claim 1, wherein side surfaces of the second via are inclined such that a width in the second direction of a lower portion of the second via is smaller than a width of an upper portion of the second via.

4. The semiconductor device of claim 1, wherein the first interconnection structure includes a conductive layer that includes at least one of aluminum (Al), ruthenium (Ru), or molybdenum (Mo).

5. The semiconductor device of claim 4, wherein the first interconnection structure further includes a liner layer disposed below the conductive layer and along a lower surface and side surfaces of the first via.

6. The semiconductor device of claim 5, wherein the liner layer includes at least one of aluminum oxide (AlOx), aluminum nitride (AlN), titanium oxide (TiO$_2$), silicon oxycarbide (SiOC), graphene, molybdenum sulfide (MoS), tantalum sulfide (TaS), or tantalum silicon (TaSi).

7. The semiconductor device of claim 1, wherein at least one of the first to third insulating layers is a low-k dielectric material layer that includes SiOCH or SiOC.

8. The semiconductor device of claim 7, wherein a concentration of carbon (C) in the low-k dielectric is material layer ranges from about 10 atomic % to about 20 atomic %.

9. The semiconductor device of claim 1, wherein the upper surface of the second insulating layer and the upper surface of the first interconnection layer form a step provided by a level difference in a vertical direction, and
wherein the step has a height ranging from about 1 nm to about 5 nm.

10. The semiconductor device of claim 1, further comprising:
an airgap between the side surfaces of the first interconnection layer and between the second and third insulating layers.

11. The semiconductor device of claim 1, further comprising:
a lower interconnection layer disposed below the first via and connected to the first via; and
a transistor that includes an active region on the substrate, a gate electrode on the active region, and source/drain regions disposed on the active region on opposite sides adjacent to the gate electrode,
wherein the lower interconnection layer is electrically connected to at least one of the gate electrode or the source/drain regions.

12. A semiconductor device, comprising:
a first insulating layer disposed on a substrate and that includes a first hole that penetrates through the first insulating layer in a vertical direction;
a second insulating layer disposed on the first insulating layer and that includes a first trench that extends in a direction parallel to an upper surface of the substrate;
a first via disposed in the first hole of the first insulating layer;
a first interconnection layer disposed in the first trench of the second insulating layer, wherein the first interconnection layer is connected to the first via and includes an upper region that protruded upward from an upper surface of the first insulating layer;
a third insulating layer disposed on the second insulating layer and the first interconnection layer, wherein the third insulating layer includes a second hole that penetrates through the third insulating layer in the vertical direction and a second trench connected to the second hole;
a second via disposed in the second hole of the third insulating layer; and
a second interconnection layer disposed in the second trench of the third insulating layer,
wherein the first trench has inclined side surfaces such that a width of the first trench increases in a direction toward the substrate,
wherein the second hole has inclined side surfaces such that a width of the second hole decreases in the direction toward the substrate, and
wherein a lower portion of the second hole is wider than an upper surface of the first interconnection layer.

13. The semiconductor device of claim 12, wherein the upper region of the first interconnection layer is disposed in the second hole, and has at least a portion surrounded by the second via.

14. The semiconductor device of claim 12, wherein the first hole includes inclined side surfaces such that a width of the first hole decreases in the direction toward the substrate.

15. The semiconductor device of claim 12, wherein the first via and the first interconnection layer are integrated with each other, and include at least one of aluminum (Al), ruthenium (Ru), or molybdenum (Mo).

16. The semiconductor device of claim 12, wherein at least one of the first to third insulating layers is a low-k dielectric material layer that includes SiOCH or SiOC.

17. The semiconductor device of claim 12, further comprising:
a liner layer disposed along a side surface of the first hole and a bottom surface of the first trench; and
a barrier layer disposed along the side surface of the second hole and a bottom surface of the second trench.

18. The semiconductor device of claim 12, further comprising:
a first etch-stop layer disposed along a lower surface of the first insulating layer, through which a lower portion of the first via penetrates; and
a second etch-stop layer disposed along a lower surface of the second insulating layer, through which an upper portion of the first via penetrates.

19. A semiconductor device, comprising:
a first insulating layer, a second insulating layer, and a third insulating layer that are sequentially disposed on a substrate;
a first via that penetrates through the first insulating layer;
a first interconnection layer connected to the first via, protrudes upward from the second insulating layer, and includes at least one region that has a linear shape when viewed in a plan view;
a second via that penetrates through the third insulating layer and covers an upper surface and a portion of side surfaces of the first interconnection layer; and
a second interconnection layer connected to the second via and that includes at least one region that has a linear shape when viewed in a plan view,
wherein a lower portion of the first interconnection layer is wider than an upper portion of the first interconnection layer, and wherein the lower portion of the first interconnection layer is wider than an upper portion of the first via.

20. The semiconductor device of claim 19, wherein the first via and the first interconnection layer are integrated with each other, and include at least one of aluminum (Al), ruthenium (Ru), or molybdenum (Mo), and wherein the second via and the second interconnection layer are integrated with each other and include copper (Cu).

* * * * *